United States Patent
Kent et al.

(10) Patent No.: US 6,240,633 B1
(45) Date of Patent: Jun. 5, 2001

(54) AUTOMATIC DEFECT DETECTION AND GENERATION OF CONTROL CODE FOR SUBSEQUENT DEFECT REPAIR ON AN ASSEMBLY LINE

(75) Inventors: Kevin Kent, Woodstock, IL (US); John Kivlin, Lake Geneva, WI (US); Eric Gasmann, Round Lake Beach, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/372,561

(22) Filed: Aug. 11, 1999

(51) Int. Cl.[7] .................................................. H05K 3/30
(52) U.S. Cl. ............................... 29/832; 29/739; 29/741; 29/742; 29/707; 29/710; 29/711; 702/35; 702/36
(58) Field of Search ............................... 29/740, 832, 835, 29/837, 739, 741, 742, 711, 706, 707, 710; 700/212; 702/33, 35, 36

(56) References Cited

U.S. PATENT DOCUMENTS 4,714,905 * 12/1987 Bernstein et al. ..................... 29/832
5,564,183 * 10/1996 Satou et al. ........................ 29/740 X
5,983,490 * 11/1999 Sakemi .................................. 29/833

* cited by examiner

*Primary Examiner*—Lee Young
*Assistant Examiner*—Rick Kiltae Chang
(74) *Attorney, Agent, or Firm*—Brinks Hofer Gilson & Lione

(57) ABSTRACT

A method for manufacturing an electronic device includes placing a plurality of components on a printed wiring board (204), detecting a defect in a component (210) and, in response, producing a defect indication including a defect location on the printed wiring board. Subsequently, additional components are placed on the printed wiring board (220) but placement of all additional components having a location which has a predetermined relation with the defect location is suspended. The defective printed wiring board may then be repaired by a technician who subsequently places the additional components over the defect location. This reduces the need to apply a large amount of heat to the printed wiring board to remove subsequently placed components such as radio frequency shields. This further reduces the possibility of additional defects occurring during repair.

15 Claims, 2 Drawing Sheets

AUTOMATIC DEFECT DETECTION AND GENERATION OF CONTROL CODE FOR SUBSEQUENT DEFECT REPAIR ON AN ASSEMBLY LINE

BACKGROUND OF THE INVENTION

The present invention relates generally to manufacturing processes. More particularly, the present invention relates to automatic detection of defects and generation of machine control code to facilitate defect repair.

During manufacturing assembly of products, many opportunities exist for creation of defects. Defects may be in the form of misplaced components, faulty or incomplete connections or out of specification electrical or mechanical features.

Implementation of a machine vision system allows monitoring, isolation and correction of defects before shipping products. Currently, a vision system identifies defects and prompts an operator to either pass the product to the next process or stop the assembly line and correct the defect. The first of these two alternatives is preferred because the assembly line operates at pulse rates far exceeding the typical repair time.

However, the passing of defective products affects downstream processes of the assembly line. Rework and repair are required. In one example, components are placed on a printed wiring board (PWB) in several steps. All components are then reflow soldered to the PWB in a single step. If the detected defect is located under a component placed during a subsequent step, the component must be removed to permit removal and repair of the defect. The removal of a subsequently placed part requires application of a large amount of heat to the PWB. This heat creates potential reliability problems for nearby components. Removal and replacement of components other than just the defective component greatly adds to the repair time and cost and introduces the possibility of additional defects.

Accordingly, there is a need for an improved method and apparatus for automatic defect detection and location, along with automatic suspension of placement of additional components in the vicinity of the defect.

DETAILED DESCRIPTION OF THE PRESENTLY PREFERRED EMBODIMENT OF THE INVENTION

By way of introduction and example only, a method for manufacturing an electronic device includes using a machine vision system to identify and locate defects in component placement on a printed wiring board (PWB). The locations of defects are transmitted to downstream processes via a network. It is determined if the defect location is shared by a subsequently-placed component such as a radio frequency (RF) shield. If so, new control code is generated to control the machine which places the subsequent component. When the defective printed wiring board arrives, placement of the interfering shield or other component is suspended. The product is then flagged for removal from the assembly line for defect repair.

Figure 1:
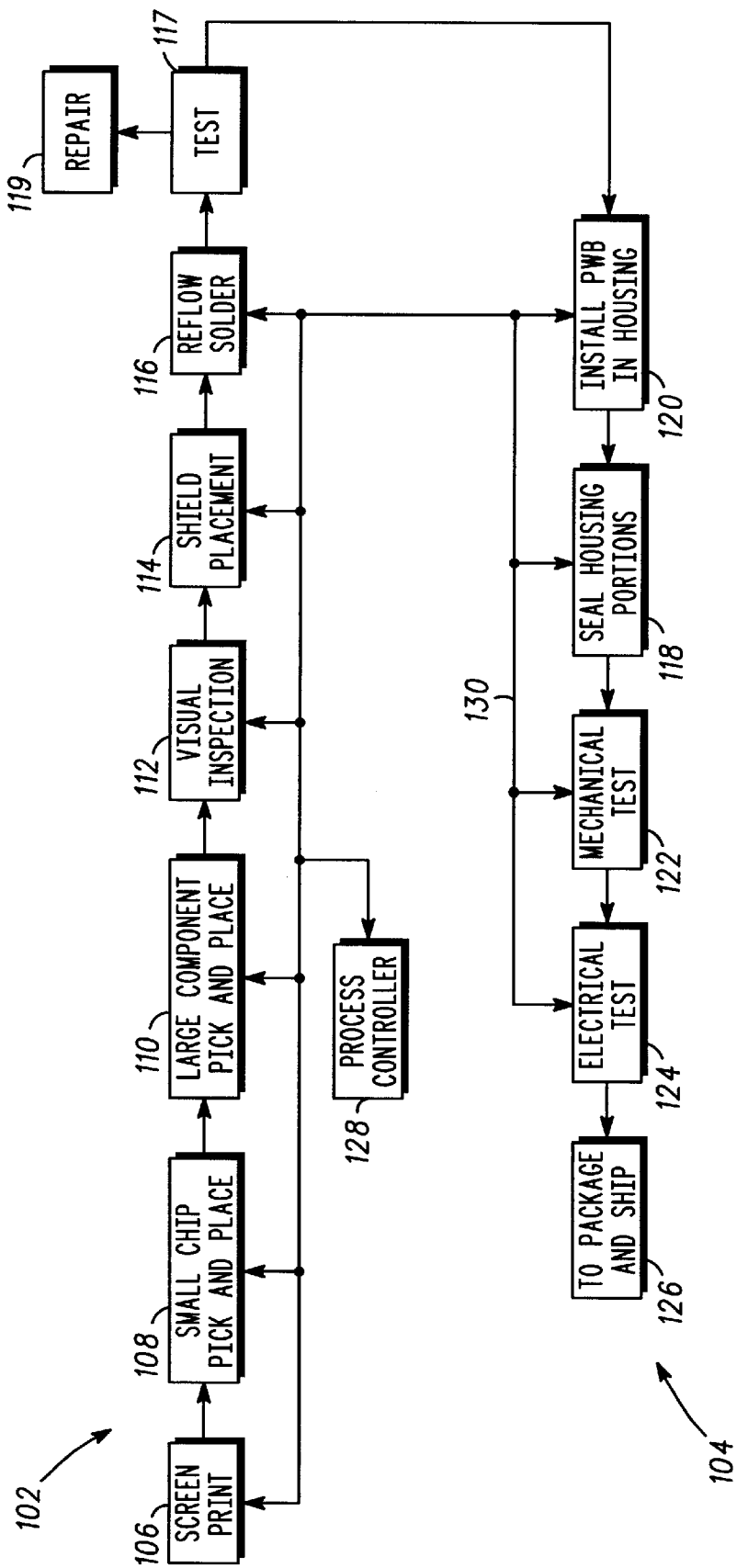
FIG. 1 is a block diagram illustrating an assembly line for manufacturing a product.

Referring now to the drawing, FIG. 1 is a block diagram illustrating an assembly line 100 for manufacturing a product. In the illustrated embodiment, which is exemplary only, the product to be manufactured on the assembly line 100 is a cellular telephone. However, it should be noted that the techniques described herein may be extended to any other suitable assembly line for manufacturing other types of products including other electronic products.

The assembly line 100 generally includes a front end 102 and a back end 104. The front end 102 is generally directed to completing the manufacture of a printed wiring board by populating the PWB with the necessary components, such as integrated circuits, resistors, wires and RF shields to form a fully functioning PWB. The front end 102 consists of a series of interconnected machines for handling a workpiece such as a PWB and placing the necessary components on one or both surfaces of the PWB. The front end 102 includes a screen printing machine 106, and a small chip pick and place machine 108, a large component pick and place machine 110, a visual inspection station 112, a shield placement machine 114, a reflow soldering station 116 and a test station 117. Also associated with the front end 102 is repair station 119.

Each workpiece or PWB is preferably identified so that the progress of the product through the assembly line 100 can be tracked and data can be collected about the manufacturing process. In one example, each PWB is affixed with a bar code which is scanned at each station of the assembly line 100. The identifier is stored along with associated manufacturing data.

At the screen printing station 106, solder paste is applied to a surface of the PWB in a predetermined pattern. The pattern of the solder paste as well as the pattern of the metallization is determined by the electrical and mechanical design characteristics of the finished component including the PWB. In the illustrated embodiment of a cellular telephone assembly line, different models of cellular telephones will have different patterns of solder paste applied to the surface of the PWB.

After application of solder paste, the PWB is advanced to the small chip pick and place machine 108. The small chip pick and place machine 108 is a high-speed, electromechanical machine that uses a robot arm to automatically place small components such as integrated circuits, resistors and chip capacitors in the correct location with the correct orientation on a surface of the printing wiring board. Dozens or hundreds of separate components may be surface mounted on the PWB. The pick and place machines operate according to software instructions and data either programmed at the machine or received externally. The software and data define the type of component to be placed, the location, the orientation of placement, etc.

The PWB is subsequently passed to the large component pick and place machine 110. This machine similarly places larger components such as wire jumpers, antenna brackets, connectors and other components too large to be reliably handled by the small chip pick and place machine 108. In some embodiments, only a single pick and place machine may be used at this point in the process for populating the PWB. The IC pick and place machine alone or in combination with the large component pick and place machine forms a first pick and place machine configured to place components on a printed wiring board.

Both the small chip pick and place machine 108 and the large component pick and place machine 110 place components on the surface of the PWB by locating the components on the surface where the solder paste has been applied. The component adheres to the solder paste. Either or both of the IC pick and place function or the large component pick and place function may be repeated to allow components to be placed on both a front side and a back side of the PWB.

Because of mechanical limitations, some defects in component placement do occur. For example, some components are not placed at all, some components are misaligned, and some components are mislocated. Some tolerance for error is designed into the product. When the component placement is outside the tolerance, it is considered to be a defect.

To identify defects, the visual inspection station 112 preferably incorporates a machine vision system. The visual inspection station 112 inspects the assembled product and identifies defects as well as the location of the defects. The type of defect and its location or reference designator are compiled in a data base associated with the product identifier. The product identifier uniquely identifies each product such as each PWB. The product identifier may be, for example, a serial number. The visual inspection station 112 forms a vision system configured to detect a defect in placement of the components on the printed wiring board and produce a defect indication. Other suitable inspection stations could be substituted for a machine vision system, as will be described below.

After visual inspection by the machine system, the PWB is advanced to the shield placement machine 114. The shield placement machine 114 forms a second pick and place machine configured to place additional components on the PWB. Radio frequency or RF shields are metallic elements placed over one or more components to shield or contain radio frequency energy that might otherwise interfere with components of the printed wiring board. Typically each shield includes a generally rectangular top portion and side portions extending from each edge of the top portion. The top portion covers and contains several components located underneath the shield on the surface of the printed wiring board. The side portions of the shield extend from the shield top surface in the direction of the printed wiring board surface. Tabs or other attachment members extend from the from the shield side portions to permit surface mounting of the shield to the surface of the printing wiring board. The shield is electrically grounded on the printed wiring board to provide electrical isolation. Shields may be placed on one or both sides of the PWB. Because the shields cover over components located beneath the shields, the shields are typically the last items placed on the surface of the PWB.

Following placement of all surface mount components on the PWB, the PWB is advanced to a reflow soldering station 116. At the reflow soldering station 116, heat is applied to one or both surfaces of the PWB to cause the solder paste on the surface to melt or reflow. When the solder paste cools and hardens, the surface mount components are effectively soldered to the surface of the PWB. Soldering forms a reliable electrical and mechanical connection between the components and the surface of the PWB. At step 117, the front end 102 is completed by performing electrical testing on the completely assembled PWB.

The back end 104 includes a series of stations which combine the completed PWB with other mechanical components of the finished electrical product. In the exemplary embodiment of FIG. 1, the PWB is mounted in a housing which is joined with a second housing portion. The completed phone is mechanically and electrically tested. Thus, the back end includes a housing installation station 118, a final mechanical assembly station 120, a mechanical test station 122 and an electrical test station 124.

At the PWB installation station 118, the completed PWB is mechanically mounted in the housing and may be installed by means of snap fit connections, screwed in, riveted in, or otherwise. Typically, the PWB is installed in one half of the housing, such as a front portion. At the same time, electrical connections are made to other portions of the completed phone, such as a keypad, a display, a speaker and a microphone. The partially completed phone assembly is then passed to station 120 where the second housing portion is joined to the first housing portion. The two housing portions may be joined by snap-fit connection, by screws or otherwise. At step 122, mechanical testing on the completed product occurs. This may include operation of mechanical components such as keypad covers and switches, as well as a drop test to ensure mechanical integrity. The product is then pass to the electrical test station for verification of electrical operation. Once the operation of the product has been verified, the product is then passed to packaging and shipment 126.

The assembly line 100 further includes a process controller 128. The process controller 128 is linked to each of the manufacturing stations by a network 130. Data related to the manufacturing operation is conveyed between the various stations and the process controller over the network 130. For example, information related to defects identified at the visual inspection station 112 is conveyed to the process controller 128. This information includes the serial number of the affected product, a description of the defect and the location of the defect. This information is encoded as data in a format recognizable and usable by the machines which form the assembly line 100. In the preferred embodiment, the assembly line 100 and its constituent machines employ a SECS/GEM (Semiconductor Equipment and Materials International Equipment, or SEMI, Communication Standard Generic Equipment Model) interface. SECS/GEM is an industry standard communication interface which permits communication among machines on the assembly line 100 and the process controller 128. The SECS/GEM interface captures machine variables in the equipment for transmission to other components of the assembly line 100.

Thus, the process controller 128 forms a controller which is coupled to the pick and place machines and the vision system and configured to receive a defect indication from the vision system. In response, the controller produces information for controlling the second pick and place machine in response to the indication. In particular, the process controller 128 produces code for controlling the second pick and place machine in response to the defect indication. The second pick and place machine, the shield placement machine 114, is configured to be responsive to the controller for suspending placement of a component on the printed wiring board when placement of the component affects the defect. The vision system, visual inspection station 112, determines a location of the defect and produces information related to the location as the defect indication.

The process controller 128 determines if a component to be placed by the shield placement machine 114 shares the location of the defect using the information provided by the visual inspection station 112. When there is an overlap or common area covered by both the defect and the shield, the process controller 128 takes steps to ensure that no shield or other component will be placed on the shield placement machine 114 over the defect. An overlap may occur, for example, if a shield is placed directly over or surrounding the defect, or if the shield location is close to the position of the defect or so positioned that removal of the shield would be required in order to correct the defect.

In response to this determination, the process controller 128 generates new code for controlling the shield placement machine 114. When the defective component arrives at the shield placement machine 114, the component is identified, for example by reading a product identifier such as a bar code associated with the workpiece. In response to identifying the defective workpiece, the shield placement machine either obtains or is provided with the replacement code generated by the process controller 128. For example, the shield placement machine 114 may transmit data identifying the PWB to the controller 128. In response, the controller 128 halts further processing by the shield placement machine, conveys the replacement code to the shield placement machine, then restarts the shield placement machine using the replacement code. The replacement code is conveyed to the shield placement machine 114 over the network 130. The replacement code controls the operation of the shield placement machine to place one or more components on the surface of the printed wiring board forming the work piece. Where a defect has been identified by the visual inspection station 112 and a particular location, the process controller 128 through the replacement code provided to the shield placement machine 114 suspends placement of all additional components having a location which has a predetermined relation with the defect location. The predetermined relation may be based on overlapping coordinates, proximity or any suitable measure.

When the component placement process at the shield placement machine 114 is completed, the product continues manufacturing on the assembly line 100 as required. When the respective product is identified at the test station 117, the workpiece is automatically ejected from the normal flow and transferred to a technician's repair station 119. When the repair technician retrieves the product and scans the product's identifier, such as a bar code, the product identification and its respective reference designators found to be defective will display on a monitor. The defective reference designator is highlighted and enables the repair technician to quickly review and repair the defect as needed. Once repaired, the repair technician assembles the subsequent part as required and returns the product to the assembly line 100 for test.

Figure 2:
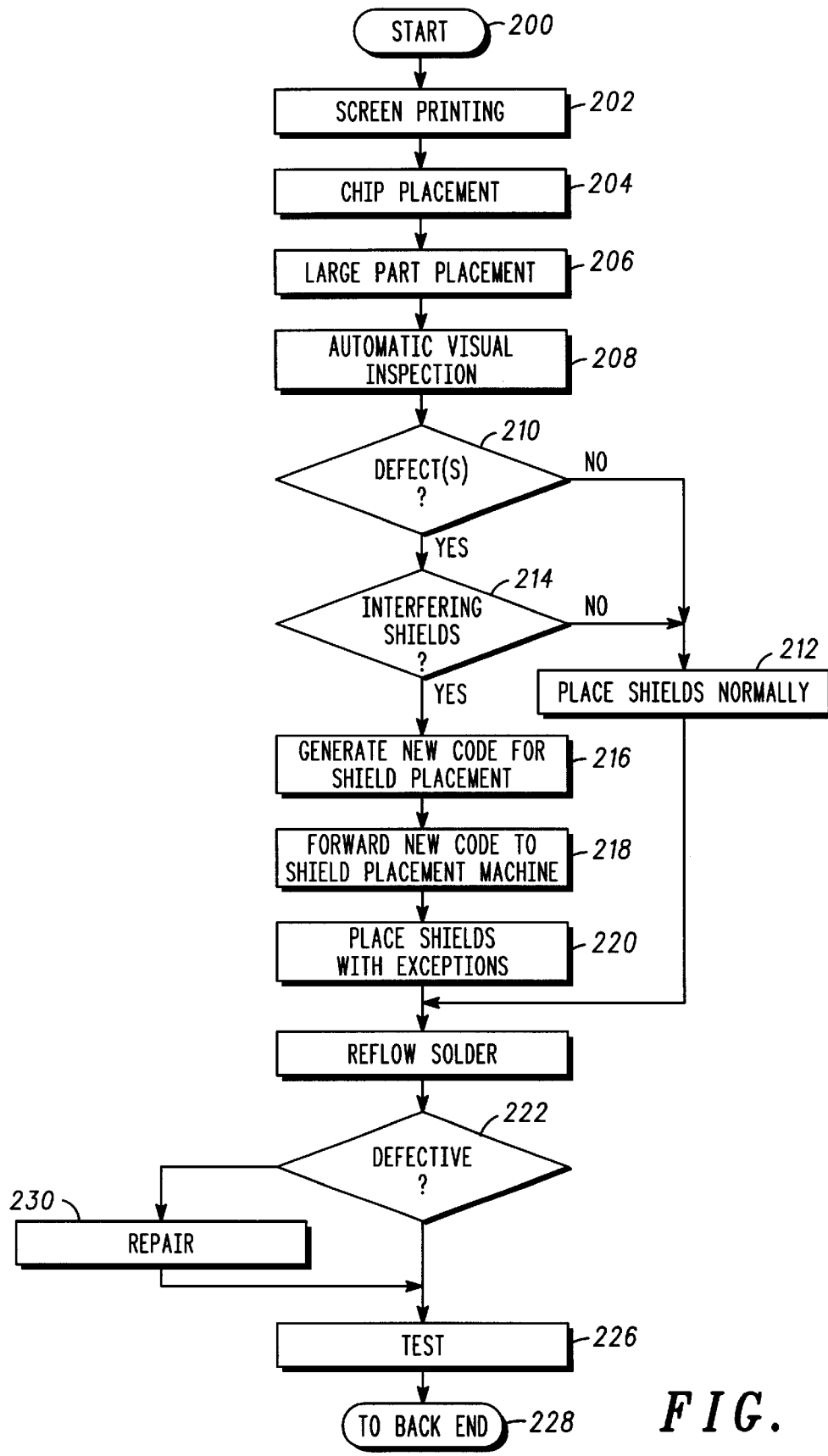
FIG. 2 is a flow diagram illustrating a method of operating the assembly line of FIG. 1.

Referring now to FIG. 2, it shows a flow diagram illustrating a method of operating the assembly line 100 of FIG. 1. The method begins at step 200 as printed wiring boards are loaded into the assembly line. At step 202, screen printing occurs as a stencil is used to apply solder paste to one or both sides of the printed wiring boards.

At step 204, a plurality of components is placed on a workpiece, the printed wiring board. In one embodiment, the plurality of components includes electronic components such as integrated circuits, resistors, capacitors, etc. In other embodiments, these components may be other suitable electrical or mechanical components suitable for combining with the workpiece. At step 206, larger components are further placed on the printed wiring board.

At step 208, automatic visual inspection occurs. In one exemplary embodiment, a machine vision system is used to identify defects and component placement, including defective orientation, defective spatial placement and other defects. Upon identifying a defect, the vision system produces a defect indication. The defect indication includes data indicative of the type of defect and a defect location on the printed wiring board. Although the embodiment illustrated herein specifically relates to information found in a machine vision system, other embodiments can include processes that contain visual inspection. For example, an automatic gang placement machine performs a presence/absence check of all components prior to placement. If a recovery attempt is unsuccessful, the gang placement machine can transfer the defect location or reference designator with the product identification to the network which controls the assembly line. The network can then dynamically regenerate a new placement program for the downstream placement processes to guarantee placement of the previously identified defect locations.

At step 210 it is determined if one or more defects were identified by the vision system. If not, at step 212 the radio frequency (RF) shields are subsequently placed in a normal fashion. However, if defects were identified, at step 214 it is determined if any shields to be subsequently placed will interfere with one or more identified defects. Interference may occur because the shield is placed directly over the defect or components that must be prepared to repair the defect, or interference may occur because the shield is sufficiently close or positioned so that repair of a defect will be more difficult if the shield is placed. If there are no interfering shields affecting the defect, at step 212 subsequent shields are placed normally.

However, if shields to be placed on the printed wiring board will interfere with the defect, at step 216 new code is generated for the shield placement step. The new or replacement code commands the subsequent placement process to skip placement of the affected subsequent part when product identification is acknowledged in the downstream placement process. At step 218, the new code or replacement code is forwarded to the shield placement machine. At step 220, the shields are placed, making exceptions for shields determined to interfere with repair of one or more defects.

At step 222, all of the components which have been placed on the surface of the printed wiring board are reflow soldered to the board. This occurs whether the shields were placed in their normal location without exception, step 212, or whether the shields were placed making exceptions for shields which interfere with identified defects, step 220.

At step 224, it is determined if the printed wiring board is defective. This determination may include electrical testing of the operation of the printed wiring board as well as mechanical and visual inspection of the results of the manufacturing process. If no defects are found, at step 226 a full operational test of the printed wiring board occurs and at step 228 the printed wiring board is passed to the back end of the assembly line for completion of the manufacturing process. If, at step 224 a defective board was identified, at step 230 a repair is made to correct the defect. A repair technician reviews the defect locations, repairs the defect and solders the RF shield to the printed wiring board, completing the assembly.

From the foregoing, it can be seen that the present embodiments provide an improved method and apparatus for manufacturing an electronic device. Using a vision system, defects in a workpiece under manufacture are observed and identified. The identified defect locations are transmitted to downstream processes via a network such as SECS/GEM. The network determines whether the defect location is under a component to be subsequently placed. If so, the network dynamically regenerates program code for controlling the pertinent downstream processes. When the product under manufacture arrives at the downstream process, the network transmits the regenerated program containing control information for skipping the placement of the subsequent parts. Those components are automatically bypassed and not placed. The product is then flagged for removal from the production line prior to test for analysis and repair of the defects. This eliminates the problem of having to remove shields as a result of defect locations under the shields.

While a particular embodiment of the present invention has been shown and described, modifications may be made. It is therefore intended in the appended claims to cover all such changes and modifications which follow in the true spirit and scope of the invention.

What is claimed is:

1. A manufacturing method for an electronic device, the method comprising:

placing a plurality of components on a workpiece (204, 206);
 automatically inspecting the workpiece (208);
 detecting a defect (210);
 in response to detecting the defect, generating replacement code to control placement of subsequent components on the workpiece (216);
 identifying a location of the defect (214);
 under control of the replacement code, if the location of the defect corresponds to location of a component to be subsequently placed on the workpiece, then suspending placement of the component to be subsequently placed (220);
  placing other components on the workpiece, the other components having locations not corresponding to the location of the defect; and
  subsequently, automatically directing the workpiece for repair of the defect (230).

2. The manufacturing method of claim 1 wherein placing components on the workpiece comprises placing a first plurality of electronic components on a surface of a printed wiring board.

3. The manufacturing method of claim 2 further comprising:

placing (220) a second plurality of electronic components on the surface of the printed wiring board; and
 suspending placement of the component to be subsequently placed.

4. The manufacturing method of claim 3 wherein placing the second plurality of electronic components comprises placing one or more radio frequency shields on the surface of the printed wiring board over at least some of the first plurality of components.

5. The manufacturing method of claim 1 further comprising:

transmitting the replacement code over a network to an assembly device for controlling the assembly device (218).

6. A method for manufacturing an electronic device, the method comprising:

placing a plurality of components on a printed wiring board (204, 206);
 detecting a defect in a component and, in response, producing a defect indication including a defect location on the printed wiring board (210);
 subsequently, placing additional components on the printed wiring board (220); and
 suspending placement of any additional components when a common area of the printed wiring board covered by both the defect location and the any additional components (220).

7. The method of claim 6 wherein producing a defect indication further comprises:

identifying the printed wiring board (PWB) with a product identifier which uniquely identifies the printed wiring board (PWB).

8. The method of claim 7 further comprising:

scanning identification information for the PWB when placing the additional components on the PWB;
 when the identification information matches the product identifier, suspending the placement of the additional components on the PWB.

9. A method for manufacturing an electronic device, the method comprising:

(a) placing a first plurality of components on a printed wiring board (PWB) (204, 206);
 (b) identifying at least one defect in component placement (210);
 (c) determining location of the at least one defect;
 (d) comparing the location of the at least one defect with locations of components to be subsequently placed on the PWB (214);
 (e) when the location of the at least one defect matches a location of a component to be subsequently placed, suspending placement of the component to be subsequently placed (220);
 (f) placing additional components having locations not matching the location of the component to be subsequently placed;
 (g) in response to comparing (d), generating code for controlling a machine which places the component to be subsequently placed on the PWB (216); and
 (h) conveying the code to the machine (218).

10. The method of claim 9 wherein step (a) comprises: placing integrated circuit components on a surface of the PWB (204).

11. The method of claim 10 wherein step (f) comprises: placing a second plurality of components on the surface of the PWB (220).

12. The method of claim 11 wherein step (f) further comprises step of:

placing one or more radio frequency (RF) shields on the surface of the PWB.

13. The method of claim 12 wherein step (d) further comprises:

comparing the location of the at least one defect with location of the one or more RF shields to be placed on the surface of the PWB.

14. The method of claim 12 wherein step (e) further comprises the step of:

suspending placement of an said one or more RF shields on the surface of the PWB when the RF shield will block access to the at least one defects.

15. A manufacturing method for an assembly line (100) including a plurality of manufacturing stations under control of a process controller (128), the method comprising:

at a first manufacturing station, placing (204) first components on a printed wiring board (PWB) under control of the process controller;
 at a second manufacturing station, automatically inspecting (208) the PWB under control of the process controller to identify defects in placement of the first components;
 if a defect is identified, storing at the process controller a location of the defect;
 at a third manufacturing station which is operable in response to program code stored at the third manufacturing station, placing additional components on the PWB, including determining a location of a component to be placed, comparing the location of the component to be placed with the location of the defect, determining if the component to be subsequently placed will interfere with the defect (214), if the component to be subsequently placed will interfere, at the process controller, generating (216) new program code for the third manufacturing station to control placement of additional components on the PWB, forwarding (218) the new program code to the third manufacturing station;

under control of the new program code, placing (220) the additional components on the PWB making exceptions for the component to be subsequently placed which will interfere with the defect.

\* \* \* \* \*

UNITED STATES PATENT AND TRADEMARK OFFICE
CERTIFICATE OF CORRECTION

PATENT NO.     : 6,240,633 B1
DATED          : June 5, 2001
INVENTOR(S)    : Kevin Kent et al.

It is certified that error appears in the above-identified patent and that said Letters Patent is hereby corrected as shown below:

<u>Claim 14,</u>
Line 3, delete "an" before "said".

Signed and Sealed this

Twenty-sixth Day of March, 2002

Attest:

Attesting Officer

JAMES E. ROGAN
*Director of the United States Patent and Trademark Office*